US012776362B2

(12) United States Patent
Ayyapureddi

(10) Patent No.: US 12,776,362 B2
(45) Date of Patent: Oct. 27, 2026

(54) SEMICONDUCTOR MEMORY DEVICE WITH PER-CHANNEL ALERT OF ROW HAMMER ATTACK

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 148 days.

(21) Appl. No.: 18/789,344

(22) Filed: Jul. 30, 2024

(65) Prior Publication Data

US 2025/0078904 A1 Mar. 6, 2025

Related U.S. Application Data

(60) Provisional application No. 63/535,366, filed on Aug. 30, 2023.

(51) Int. Cl.
*G11C 11/4078* (2006.01)
*G11C 11/406* (2006.01)

(52) U.S. Cl.
CPC .... *G11C 11/4078* (2013.01); *G11C 11/40615* (2013.01); *G11C 11/40622* (2013.01)

(58) Field of Classification Search
CPC .................................................. G11C 11/4078
See application file for complete search history.

(56) References Cited

U.S. PATENT DOCUMENTS

2022/0223195 A1* 7/2022 Ayyapureddi ...... G11C 11/4078
2023/0143905 A1* 5/2023 Kim ...................... G11C 11/408 365/222
2023/0409708 A1* 12/2023 Wang ....................... G11C 7/24
2024/0096395 A1* 3/2024 Cho .................. G11C 11/40622
2024/0211344 A1* 6/2024 Bains ..................... G11C 29/44
2024/0427497 A1* 12/2024 Lu ......................... G06F 3/0673
2024/0428845 A1* 12/2024 Song .................. G11C 11/4078

* cited by examiner

*Primary Examiner* — Amir Zarabian
*Assistant Examiner* — Anthony Thinh Tang
(74) *Attorney, Agent, or Firm* — Dorsey & Whitney LLP

(57) ABSTRACT

Disclosed are methods, systems, and apparatuses for providing per-channel row hammer alerts, from a memory device to a host, without the use of a dedicated per-channel alert interface. When detecting a row hammer alert condition, the memory device may determine whether an existing interface (e.g., a severity interface used to transmit severity information) is available. The interface may be available outside of certain designated burst positions during a read burst. Once the interface is available, the memory device may transmit a row hammer alert indication to the host. The host may determine whether information received over the interface is associated with a row hammer alert or severity, depending on when the information was received (e.g., in what burst position during a read burst).

20 Claims, 5 Drawing Sheets

300

302

| Severity | Pin | Burst Position 0 | 1 | 2 | 3 | 4 | 5 | 6 | 7 |
|---|---|---|---|---|---|---|---|---|---|
| NE (310) | SEV[0] | RH Alert | RH Alert | RH Alert | RH Alert | 0 | 0 | 0 | 0 |
| | SEV[1] | RH Alert | RH Alert | RH Alert | RH Alert | 0 | 0 | 0 | 0 |
| CEs (315) | SEV[0] | RH Alert | RH Alert | RH Alert | RH Alert | 1 | 1 | 1 | 1 |
| | SEV[1] | RH Alert | RH Alert | RH Alert | RH Alert | 0 | 0 | 0 | 0 |
| CEm (320) | SEV[0] | RH Alert | RH Alert | RH Alert | RH Alert | 1 | 1 | 1 | 1 |
| | SEV[1] | RH Alert | RH Alert | RH Alert | RH Alert | 1 | 1 | 1 | 1 |
| UE (325) | SEV[0] | RH Alert | RH Alert | RH Alert | RH Alert | 0 | 0 | 0 | 0 |
| | SEV[1] | RH Alert | RH Alert | RH Alert | RH Alert | 1 | 1 | 1 | 1 |

330 (burst positions 0–3), 305 (burst positions 4–7)

*FIG. 3*

SEMICONDUCTOR MEMORY DEVICE WITH PER-CHANNEL ALERT OF ROW HAMMER ATTACK

CROSS-REFERENCE TO RELATED APPLICATION(S)

The present application claims priority to U.S. Provisional Patent Application No. 63/535,366, filed Aug. 30, 2023, the disclosure of which is incorporated herein by reference in its entirety.

TECHNICAL FIELD

The present disclosure generally relates to a memory device and, more specifically, relates to a memory device that enables alerting a host of row hammer attacks on individual channels of the memory device.

BACKGROUND

Memory devices are widely used to store information related to various electronic devices such as computers, wireless communication devices, cameras, digital displays, and the like. Memory devices may be volatile or non-volatile and can be of various types, such as magnetic hard disks, random access memory (RAM), read-only memory (ROM), dynamic RAM (DRAM), synchronous dynamic RAM (SDRAM), and others. Information is stored in various types of RAM by charging a memory cell to have different states. Improving RAM devices, generally, can include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

The present disclosure will be understood more fully from the detailed description given below and from the accompanying drawings of various embodiments of the disclosure.

FIG. 3 illustrates a severity interface encoding in accordance with an embodiment of the present technology.

DETAILED DESCRIPTION

Figure 1:
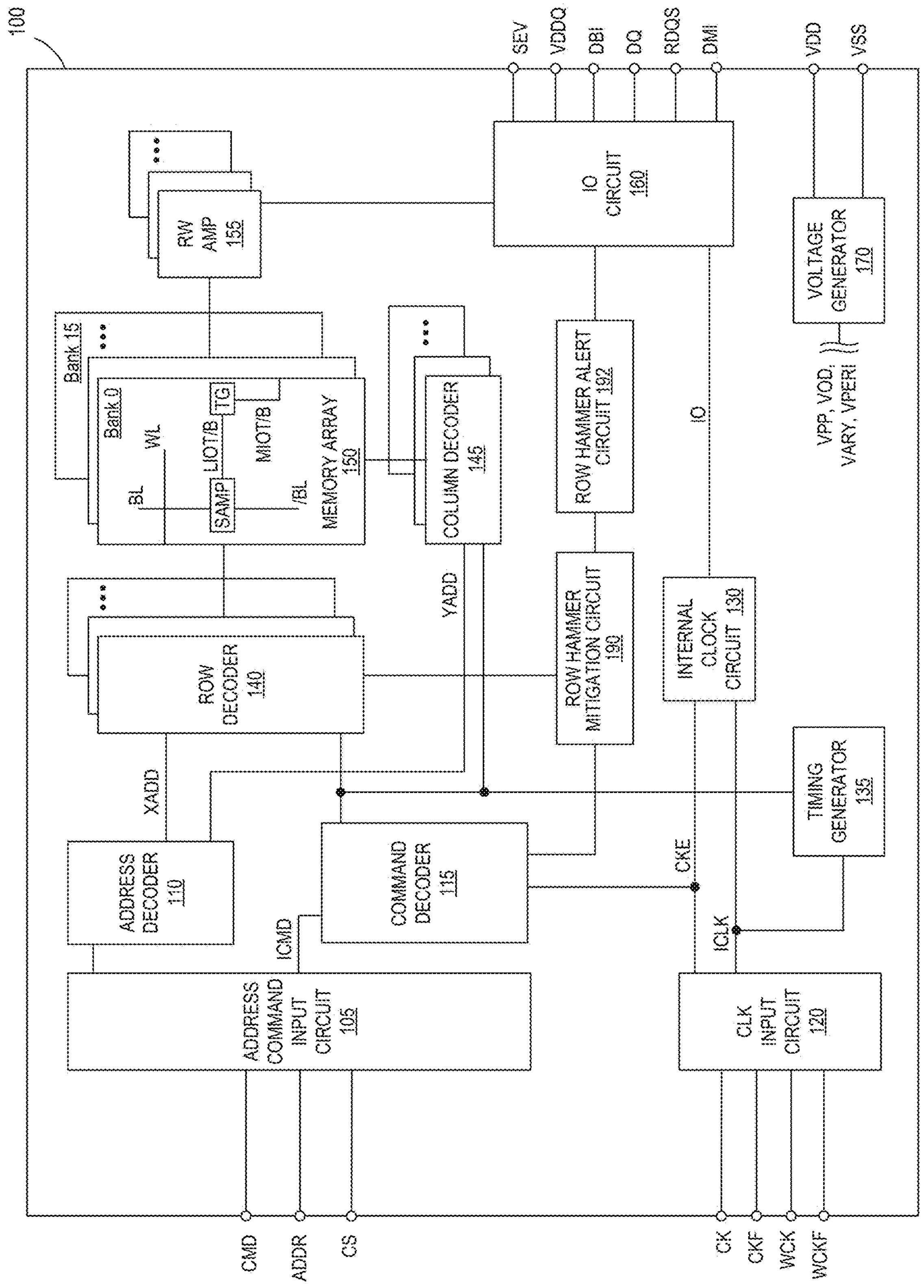
FIG. 1 illustrates a simplified block diagram schematically illustrating a memory device in accordance with an embodiment of the present technology.

High data reliability, high speed of memory access, lower power consumption, and reduced chip size are features that are demanded from semiconductor memory. In recent years, three-dimensional (3D) memory devices have been introduced. Some 3D memory devices are formed by stacking memory dies vertically and interconnecting the dies using through-silicon (or through-substrate) vias (TSVs). Benefits of the 3D memory devices include shorter interconnects (which reduce circuit delays and power consumption), a large number of vertical vias between layers (which allow wide bandwidth buses between functional blocks, such as memory dies, in different layers), and a considerably smaller footprint. Thus, the 3D memory devices contribute to higher memory access speed, lower power consumption, and chip size reduction. Example 3D memory devices include Hybrid Memory Cube (HMC) and High Bandwidth Memory (HBM). For example, HBM is a type of memory that includes a vertical stack of DRAM dies and an interface die (which, e.g., provides the interface between the DRAM dies of the HBM device and a host device).

Some semiconductor memory devices used in 3D memory devices (including HBM devices), such as DRAM, store information as a charge accumulated in cell capacitors that can be prone to leakage and which therefore require periodic refresh operations to prevent the information from being lost. In addition to charge leakage, the information may be lost or degraded by bit errors caused by disturb mechanisms such as row hammer (e.g., repeated access of the same storage location or row within a threshold duration). Row hammer affects memory cells coupled to a non-selected word line adjacent to a selected word line that is repeatedly driven to an active level in a short time. The activity on the selected word line can cause the charge in the cells of the adjacent non-selected word line to vary, putting the information stored therein at risk, unless a refresh operation is executed to refresh the charge in the memory cells.

In some memory devices, auto-refresh (AREF) commands indicating refresh operations are periodically issued from a control device such as a host or a controller operably coupled to the memory device. The AREF commands are provided from the control device at a frequency such that all the word lines will be refreshed once in a refresh cycle. However, since the refresh addresses according to the AREF commands are determined by a refresh counter provided in DRAM, refresh operations responsive to the AREF commands may not prevent bit errors due to row hammer effects. Thus, memory devices may include additional capabilities to address row hammer effects.

One approach to addressing row hammer effects involves providing a memory device with circuitry to redirect or steal a portion of the available refresh opportunities (e.g., the regularly scheduled refresh commands received from a host device) to specific victim rows where hammer activity has been detected (e.g., adjacent to a row where a large number of activation commands have been executed). For example, a row hammer mitigation circuit may count the number of times a row has been activated since a prior refresh of the adjacent victim rows. If the row activation count exceeds a threshold number, the row hammer mitigation circuit can initiate refreshes of the adjacent victim rows to address row hammer effects on those rows. For example, the row hammer mitigation circuit may add the row addresses of victim rows to a queue for refresh operations (otherwise referred to as a mitigation queue) so that the victim rows are refreshed.

Memory devices, and row hammer mitigation circuits, may adopt different approaches to count the number of row activations since a prior refresh. For example, some devices may employ a probabilistic-based approach in which row addresses are randomly sampled during activations, and if any row address is sampled too frequently and/or greater than a threshold number of times during a sampling window, the adjacent victim rows are refreshed. As a further example, some memory devices may employ per-row hammer tracking (PRHT) in which activation counter bits are stored in each row of the memory device's memory array. With PRHT, the activation counter bits may be incremented and written back to the memory array each time a row is activated, and once a counter exceeds a threshold, the adjacent victim rows are refreshed.

In certain memory devices, such as those that employ PRHT and/or random sampling of activated row addresses, the threshold used to determine whether to refresh victim rows may be fixed and/or statically configured (e.g., based on memory device characteristics and the sensitivity of adjacent victim rows on row hammer effects). As a result, the memory devices and row hammer mitigation circuits may have a deterministic behavior in which refresh operations are predictably generated for victim rows after a sufficient number of activations of an adjacent row. Furthermore, with the continual reduction in the geometries of memory arrays, and the corresponding increase in sensitivity to row hammer effects, the threshold number of adjacent-row activate commands that can be allowed to occur before a victim row is refreshed continues to decrease. These factors can enable a hostile actor to exploit row hammer effects, and the deterministic operations of row hammer mitigation circuits, to intentionally overwhelm memory devices with targeted row hammer activity to detrimental effect (e.g., degradation of data in a memory array).

In one such attack, generally referred to as a waterfall attack, multiple victim rows in an array are targeted by row hammer activity (e.g., by activate commands directed to one or more rows adjacent to the victim rows) to bring the count of adjacent-row activations close to, but still below, the threshold number that would trigger a targeted refresh of the victim rows. Once a sufficiently large number of such victim rows have been so primed, the attack involves targeted activations of the adjacent rows, thereby pushing a large number of victim rows past the threshold number in short order. Typically, the memory device so attacked will respond by adding all of the victim rows to a queue (e.g., the mitigation queue) for refresh operations. By doing so, any of several undesirable results may occur. For example, if the number of victim row addresses to be added to the mitigation queue exceeds the capacity of the mitigation queue, the memory device may omit adding victim row addresses to the mitigation queue once queue capacity is reached. In such a scenario, the victim rows omitted from the mitigation queue may experience a change in value (e.g., bit flips in the data can occur), resulting in a memory device error. As a further example, even if the mitigation queue has the capacity for all of the victim rows to be added, in the time it takes to complete corresponding refresh operations on all victim row addresses in the mitigation queue additional activate commands may continue to hammer the same set of victim rows such that their contents can be degraded before they have been refreshed (e.g., due to their position in the mitigation queue).

To address the undesirable results caused by row hammer attacks and/or waterfall attacks (collectively, "row hammer attacks" or "attacks"), it can be beneficial for a memory device to be able to signal to a host when the memory device is under attack. For example, and as described herein, a memory device may generate an alert signal when a threshold number of rows are primed for attack (e.g., enough rows each have an activation count close to, but still below, the number that would trigger a refresh of adjacent victim rows), when a mitigation queue is at a threshold utilization (e.g., the queue is filled above a certain number of victim row addresses to be refreshed and/or the queue contains above a certain number of victim row addresses associated with the portions of the memory array), and/or in response to other conditions that could ordinarily lead to a loss of and/or change to stored data. The host, upon receiving the alert signal, may suspend or slow down the rate of requests to the memory device, thereby giving the memory device additional time to respond to the attack. For example, if a host suspends sending new read and/or write requests to the memory device while the alert signal is active, the memory device can refresh the already-identified victim rows before the victim rows are activated again and/or additional rows become victim rows. Once the memory device successfully responds to the attack (e.g., enough victim rows are refreshed), it can de-assert the alert signal and normal operations can be resumed.

In some memory systems, a single alert signal may be used to indicate a row hammer attack on any of multiple memory devices. For example, some memory systems include one or more memory modules (e.g., a dual in-line memory module, or DIMM), each of which includes multiple (e.g., 10 or more) memory devices (DRAM die, DRAM device, etc.). Some memory modules (e.g., DIMMs that comply with certain versions of the Double Data Rate (DDR) SDRAM standard, such as DDR5) have a single alert signal between it and the host, which is asserted when any memory device on the memory module is under a row hammer attack. In said memory modules, each memory device may have an alert pin over which an alert signal can be transmitted (e.g., when the memory array of the memory device is under a row hammer attack), all of which are combined (e.g., ORed together) to generate the module's alert signal that is transmitted to the host.

However, signaling a row hammer attack to a host can present certain challenges in memory systems that include 3D memory devices, such as HBM devices, due to differences between 3D memory devices and other types of memory devices (e.g., DDR5 DIMMs). An HBM device is made up of multiple channels, each of which provides an independent interface to a host. That is, each channel includes an independent clock, command, data, etc., interface to the host. Further, each channel provides access to an independent set of storage within the HBM device (e.g., independent set of DRAM banks) such that host requests on one channel may not access storage associated with another channel. Further, each HBM channel may be further divided into two individual subchannels, or pseudo channels (PCs), that may operate semi-independently. The two PCs of a channel may share certain portions of the channel interface (e.g., the clock, the row and column command bus, etc.) but may otherwise be independent. For example, the two PCs may have independent data buses, may provide access to different portions of the channel's storage, and may decode and execute commands individually. A device compliant with the HBM3 specification (e.g., an HBM3 device) may support up to 16 independent channels (each of which may be further divided into two PCs), while HBM devices compliant with future specifications may support more channels (e.g., 32 channels, 64 channels, etc.). For example, an HBM4 device may support up to 32 independent channels (and, correspondingly, 64 PCs). In contrast, a DDR5 DIMM supports two channels per DIMM.

Because of the relatively large number of channels supported by HBM devices, which is expected to increase over time, conventional solutions for how an HBM device may alert a host to a row hammer attack may suffer from various shortcomings. Each channel and/or PC of an HBM device may independently detect an alert condition (e.g., a situation where a sufficient number of rows associated with the channel and/or PC are primed and/or there are a sufficient number of victim rows associated with the channel and/or PC). One solution therefore is for an HBM device to have an alert pin, per channel and/or PC, over which the HBM device could signal alert conditions to a host. Such a solution could enable a host to identify the particular channel and/or PC under attack and only pause host requests to that channel/PC while maintaining normal operations with other channels/PCs, but this solution may not be feasible due to the amount of area involved (e.g., an additional 32 alert pins on a 32-channel HBM device) and/or routing resources required (e.g., between the HBM device and a host, such as through a silicon interposer). An alternative solution is for an HBM device to combine channel/PC-specific alert signals into a single alert signal transmitted to the host, similar to the approach described above for DDR5. Such a solution may be beneficial from an area and/or routing perspective but may not be feasible from a performance perspective. For example, it would be inefficient if in a memory system with a 32-channel HBM device a host were to pause sending any requests to the HBM device (e.g., all 32 channels) if only a single channel was under attack.

Accordingly, described herein are memory systems, components therein (e.g., memory devices, HBM devices, hosts, and memory controllers), and associated methods that provide the signaling of per-channel and/or per-PC alerts, in response to a row hammer attack or associated condition, without the use of a dedicated pin or interface. As described herein, per-channel and/or per-PC alert information can be transmitted by overloading existing pins and/or interfaces of the memory system. Advantageously, the systems, apparatuses, and methods for overloaded per-channel alert signaling can indicate to a host the particular channel (or PC) of a device that is under a row hammer attack, thereby enabling the host to maintain normal operations with all other channels (or PCs) without requiring additional pins and/or signal routing between HBM devices and the host. Though described in some instances as per-channel alert signaling, in embodiments of memory systems in which channels are divided into PCs, the systems, apparatuses, and methods described herein may provide per-PC alert signaling.

A memory device, including an HBM device, that provides overloaded per-channel alert signaling may signal the occurrence of a row hammer attack, or related condition, over an existing per-channel or per-PC interface between the memory device and a host during windows in which the interface is not ordinarily utilized by conventional memory devices. In some embodiments, a severity interface of an HBM3 device or other HBM devices (e.g., an HBM4 device) is used to signal an alert, for an individual channel or PC, to a coupled host. That is, the HBM device may include a per-PC severity interface over which the HBM device can transmit data indicating the severity of an error detected by on-die error correction code (ECC) processing. For example, an HBM3 device may include two severity (SEV) pins per PC, although embodiments of memory devices that provide overloaded per-channel alert signaling may have other numbers of SEV pins per PC and/or per channel.

As described herein, an HBM device that provides overloaded per-channel alert signaling may transmit ECC severity information over the SEV pins during only certain windows. For example, the HBM device may transmit severity information over the SEV pins, in response to a read request from a host, while some of the read data is transmitted by the HBM device to the host. In some embodiments, the read data requested by the host is transmitted by the HBM device over multiple clock cycles and/or clock phases and referred to as a burst. A portion of the read data may be transmitted by the HBM device during a unit interval (UI), and each UI may take a clock cycle, a clock phase, etc. The number of UIs (e.g., the number of clock cycles and/or clock phases) used to transmit the requested read data represents the HBM device's burst length (BL), and the burst position represents an ordered sequence during the burst. That is, a first burst position (e.g., burst position 0) represents the first clock cycle and/or phase of a burst (e.g., UI0), a second burst position (e.g., burst position 1) represents the second clock cycle and/or phase of a burst (e.g., UI1), and so on. For example, a HBM3 device may have a burst length of 8 (BL8), which means that read data requested by a host is transmitted by the HBM3 device over 8 burst positions (e.g., UI0-UI7), each of which is a clock phase. A conventional HBM3 device transmits severity information over the SEV pins during UI4-UI7 of a read data burst (e.g., when requested read data is transmitted), and the SEV pins are unused during other burst positions (e.g., UI0-UI3) of the read data transmission. Other HBM devices may have other burst lengths and similarly transmit severity data over the SEV pins during only some of the burst positions. For example, in some embodiments an HBM4 device may have a burst length of up to 32 (BL32) and transmit severity information during only some of the burst positions during which requested read data is transmitted (e.g., only some of UI0-UI31). In some embodiments an HBM4 device may be configured for BL8, and transmit severity information during UI4-UI7.

In embodiments of a memory system with overloaded per-channel alert signaling, a memory device (e.g., an HBM device) transmits alert information, indicative of a row hammer attack or associated condition, when the SEV pins are not used to transmit severity information. For example, in an HBM3 device configured for BL8 operations, the alert information may be transmitted during any of UI0-UI3, alone or in any combination, during the transmission of read data. As a further example, in an HBM4 device configured for BL8 operations, the alert information may be transmitted during any of UI0-UI7, alone or in any combination and excluding burst positions during which severity information is transmitted, during the transmission of read data. As a still further example, in an HBM4 device configured for BL32 operations, the alert information may be transmitted during any of UI0-UI31, alone or in any combination and excluding burst positions during which severity information is transmitted, during the transmission of read data. In still further examples, the memory device with overloaded per-channel alert signaling may be compliant with any version of the HBM specification (e.g., HBM2, HBM3, HBM4, etc.) and be configured for any burst lengths (e.g., BL4, BL8, BL16, BL24, BL32, etc.), and may transmit alert information during other burst positions within the burst.

Memory devices that provide overloaded per-channel alert signaling may include logic, per channel and/or per PC, that detects row hammer alert conditions potentially impacting memory device storage associated with the channel or PC. For example, an HBM device may include logic to detect when any PC of the HBM device is under attack. In some embodiments, and as described herein, the logic is replicated in the HBM device. For example, each DRAM die within the HBM device may include row hammer alert logic to detect row hammer attacks impacting the PCs of the DRAM die. In some embodiments, row hammer alert logic is replicated for each PC on the DRAM die (e.g., a DRAM die with four PCs would include four instances of the row hammer alert logic, a DRAM die with 16 PCs would include 16 instances of row hammer alert logic, etc.). As described herein, the row hammer alert logic can detect conditions indicating the associated PC is under attack, and where it may be beneficial for a host to temporarily suspend sending new requests to that PC, and assert an alert signal accordingly. For example, the row hammer alert logic may detect when a number of memory array rows associated with the PC, exceeding a threshold, have per-row activation counts (e.g., stored in the row) that are close to exceeding a refresh threshold (e.g., are primed for refresh) and assert an alert signal accordingly. As a further example, the row hammer alert logic may detect when a mitigation queue has a number of victim rows, associated with the PC, that exceeds a threshold and assert an alert signal accordingly. As described herein, the row hammer alert logic may then drive an alert signal onto one or more SEV pins associated with the PC when the SEV pins are available (e.g., not being used to transmit severity information as part of a read response from the memory device). Advantageously, the row hammer alert logic can detect conditions indicative of row hammer attacks on individual channels and/or PCs and can utilize the SEV pins associated with each channel and/or PC to communicate the occurrence of a row hammer attack to a host on a per-channel or per-PC basis without adding a new alert interface and/or alert pins between the memory device and host.

In embodiments of a memory system with overloaded per-channel alert signaling, a control device (e.g., a host and/or controller) can be configured to monitor the SEV pins from a memory device outside of the windows during which severity information is transmitted. For example, if a conventional host, coupled to an HBM3 device, monitors the SEV pins of a PC only during UI4-UI7 of data being transmitted by the HBM3 device, a host in accordance with embodiments of the described technology may monitor the SEV pins at other times as well. In some embodiments, a host that provides overloaded per-channel alerts monitors the SEV pins during other burst positions of a read data transmission. In some embodiments, a host that provides overloaded per-channel alerts monitors the SEV pins even when read data is not being transmitted to the host (e.g., outside of a read burst). In other words, a host that provides overloaded per-channel alert signaling may monitor the SEV when severity information is conventionally sent (e.g., UI4-UI7 of a read transmission when the host is coupled to an HBM3 device) and additionally monitor the SEV pins when severity information is not conventionally sent to detect a row hammer alert condition. The host may further be configured to detect whether information transmitted on the SEV pins is severity information or a row hammer alert condition, depending on when the information is transmitted. Advantageously, the signaling of a row hammer alert condition on a per-PC interface, such as SEV pins, enables the host to suspend requests sent to impacted PCs while mainlining normal operations with other PCs without requiring a new alert interface and/or alert pins between the host and memory devices.

FIG. 1 illustrates a simplified block diagram schematically illustrating a memory device 100 in accordance with embodiments of the present technology. The memory device 100 may be, for example, a semiconductor die assembly, including a three-dimensional integration (3DI) device or a die-stacked package. The memory device 100 can include a DRAM or a portion thereof that includes one or more dies/chips. For example, the memory device 100 can be an HBM device comprised of one or more DRAM dies/chips, an interface die, and/or a DRAM die/chip or interface die within an HBM device.

The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMPs) may be provided for corresponding bit lines BL and connected to at least one respective local input/output (I/O) line pair (LIOT/B), which may, in turn, be coupled to at least one respective main I/O line pair (MIOT/B) via transfer gates (TG), which can function as switches.

The memory device 100 may employ a plurality of external terminals that include command and address terminals coupled to a command bus and an address bus (e.g., a command/address bus) to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI (for data bus inversion function), DMI (for data mask inversion function), severity terminal SEV (for severity information and row hammer alert indication), power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via an address/command input circuit 105, to an address decoder 110. The address decoder 110 can receive the address signals and supply a decoded row address signal (XADD) to the row decoder 140 and a decoded column address signal (YADD) to the column decoder 145. The address decoder 110 can also receive the bank address portion of the ADDR input and supply the decoded bank address signal (BADD) and supply the bank address signal to both the row decoder 140 and the column decoder 145.

The command and address terminals may be supplied with command signals CMD, address signals ADDR, and chip select signals CS from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the address/command input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK (not shown in FIG. 1).

The command decoder 115, in some embodiments, may further include one or more registers for tracking various counts or values (e.g., counts of refresh commands received by the memory device 100 or self-refresh operations performed by the memory device 100). In some embodiments, a subset of registers may be referred to as mode registers and configured to store user-defined variables to provide flexibility in performing various functions, features, and modes and/or to provide information characterizing aspects of the memory device 100. For example, the memory device 100 may receive a signaling from a host device to program mode registers with specified values (e.g., to configure the memory device). As a further example, the memory device 100 may receive a signaling from a host device to read out the values from certain mode registers (e.g., to obtain certain status information from the memory device).

When a read command is issued to a bank with an open row and a column address is timely supplied as part of the read command, read data can be read from memory cells in the memory array 150 designated by the row address (which may have been provided as part of the Activate command identifying the open row) and column address. The read command may be received by the command decoder 115, which can provide internal commands to IO circuit 160 so that read data can be output from the data terminals DQ, RDQS, DBI, and DMI via read/write amplifiers 155 and the IO circuit 160 according to the RDQS clock signals. The read data may be provided at a time defined by read latency information (RL) that can be programmed in the memory device 100, for example, in a mode register. The read latency information RL can be defined in terms of clock cycles of the CK clock signal. For example, the read latency information RL can be a number of clock cycles of the CK signal after the read command is received by the memory device 100 when the associated read data is provided. The read data may also be processed by an ECC engine (not shown), which can detect and correct a certain number of errors in the data read from the memory array 150. Information regarding the severity of any errors detected in the read data by the ECC engine may be output from the severity terminal SEV with the read data. As described herein, the read data may be output from the data terminals (e.g., DQ) during a burst made up of multiple burst positions (e.g., UI0-UI7, UI0-UI31, etc.), while the severity information is output on the severity terminal SEV during only some of the burst positions of the read data burst (e.g., UI0-UI3).

When a write command is issued to a bank with an open row and a column address is timely supplied as part of the write command, write data can be supplied to the data terminals DQ, DBI, and DMI according to the WCK and WCKF clock signals. The write command may be received by the command decoder 115, which can provide internal commands to the IO circuit 160 so that the write data can be received by data receivers in the IO circuit 160 and supplied via the IO circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in a mode register. The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the SAMPs included in the memory array 150, and the internal potential VPERI can be used in many other circuit blocks.

The power supply terminal may also be supplied with power supply potential VDDQ. The power supply potential VDDQ can be supplied to the IO circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 160 so that power supply noise generated by the IO circuit 160 does not propagate to the other circuit blocks.

The on-die termination terminal(s) may be supplied with an on-die termination signal ODT. The on-die termination signal ODT can be supplied to the IO circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, and WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level, a complementary clock signal is at a high level, and when the clock signal is at a high clock level, the complementary clock signal is at a low clock level. Moreover, when the clock signal transitions from the low clock level to the high clock level, the complementary clock signal transitions from the high clock level to the low clock level, and when the clock signal transitions from the high clock level to the low clock level, the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase- and frequency-controlled internal clock signals based on the received internal clock signals ICLK and a clock enable signal CKE from the command decoder 115. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the IO circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135, and thus various internal clock signals can be generated.

The memory device 100 can additionally include circuits implementing mechanisms to detect and mitigate attacks on the memory device, such as row hammer mitigation circuit 190 and/or row hammer alert circuit 192.

The row hammer mitigation circuit 190 can be configured to determine when the memory device 100 is the target of a row hammer attack by determining that a victim row has been subject to a very high number of disturb effects caused by adjacent-row activate commands since the last refresh operation at the victim row. In some embodiments the row hammer mitigation circuit 190 maintains a count, for each row in memory array 150, of activation commands targeting that row since its last refresh operation (e.g., from which can be determined the amount of row hammer disturb effects imparted to adjacent rows). In some embodiments, the row hammer mitigation circuit 190 maintains a count, for each row in memory array 150, of activation commands directed to neighboring rows (e.g., immediately adjacent rows and/or rows within a predetermined physical distance from the tracked row) since the last time the tracked row was refreshed. In some embodiments, the counts are stored in the memory array 150 (e.g., each row in the memory array includes additional count bits for storing the count). In some embodiments, the row hammer mitigation circuit 190 generates probabilistic-based counts based on random sampling of accessed row addresses. Based on these maintained counts, the row hammer mitigation circuit 190 can determine when a row should be refreshed to mitigate row hammer effects. To do so, the row hammer mitigation circuit 190 can monitor the maintained counts, determine if the counts of any rows exceed a row hammer mitigation threshold, and initiate refresh operations for rows whose counts exceeds the threshold. For example, the row hammer mitigation circuit 190 can add the addresses of any victim rows exceeding the threshold to a mitigation queue such that the rows will be refreshed. (e.g., add the rows' addresses to a mitigation queue).

The row hammer alert circuit 192 can be configured to detect conditions associated with a row hammer attack and generate an alert signal. As described herein, the row hammer alert circuit 192 may generate the alert signal based on conditions that indicate an undesirable result may occur (e.g., data loss in the memory array 150) without intervention by a host coupled to the memory device 100. For example, the row hammer alert circuit 192 may detect conditions that indicate the row hammer mitigation circuit 190 may not be able to keep up with mitigating an ongoing attack if the host continues to generate requests to access rows in the memory array 150. In some embodiments, the row hammer alert circuit 192 can determine which rows in the memory array 150 are primed (e.g., have an activation count just less than, but not yet exceeding, the activation threshold at which the row would be queued for refresh) and compare the number of primed rows to a primed row threshold. If the number of primed rows equals or exceeds the primed row threshold (e.g., indicating that a number of rows in the memory array 150 could soon require refreshes), the row hammer alert circuit 192 may generate a row hammer alert signal. In some embodiments, the row hammer alert circuit 192 can evaluate the utilization of a mitigation queue (e.g., part of the row hammer mitigation circuit 190) to determine how many victim row addresses have been queued for refresh. In some embodiments, the row hammer alert circuit 192 may evaluate mitigation queue utilization associated with portions of the memory array 150. For example, the row hammer alert circuit may determine the number of entries in the mitigation queue associated with individual banks of the memory array 150 (e.g., generate per-bank counts of mitigation queue entries) and can evaluate whether any bank's count exceeds a per-bank queue threshold. If the mitigation queue utilization equals or exceeds a threshold (e.g., indicating that a number of victim rows are queued to be refreshed and/or the mitigation queue has only a certain available capacity remaining), the row hammer alert circuit 192 may generate a row hammer alert signal.

The row hammer alert circuit 192 can output the generated row hammer alert signal over the severity terminal SEV. As described above, the severity terminal SEV may also be used to output severity information (e.g., generated in response to a read request). Accordingly, the row hammer alert circuit 192 may be configured to output the row hammer alert signal over the severity terminal SEV when the terminal is not being used to output severity information (and, when severity information would conventionally be output over the terminal, allow any severity information to be output over the severity terminal SEV). When the row hammer alert circuit 192 generates a row hammer alert signal, it can determine whether severity information may be output at that time over severity terminal SEV. For example, the row hammer alert circuit 192 can determine whether the memory device 100 is outputting read data over the data terminals (e.g., DQ) in response to a read request from a host. If the memory device is outputting read data in response to a read request, the row hammer alert circuit 192 can further determine the current burst position within the read burst. If the row hammer alert circuit 192 determines that the severity terminal SEV could be used at that time to output severity information (e.g., it determines the memory device 100 is currently outputting burst positions UI4-UI7 of a BL8 burst of read data), it can save state (e.g. a flip-flop, mode register, etc.) indicating that a row hammer alert condition has been detected. Once the row hammer alert circuit 192 determines that the severity terminal SEV is available for alert information (e.g., the memory device 100 is not outputting read data over the data terminals and/or the device is outputting a burst position during which severity information would not be transmitted), it can output the generated row hammer alert signal and/or saved row hammer alert state over the severity terminal SEV. In embodiments, the row hammer alert circuit 192 continues to output the row hammer alert indication over the severity terminal SEV until it determines that the attack condition has been relieved (e.g., enough victim rows have been refreshed).

As described herein, a host coupled to the memory device 100 can be configured to monitor the severity terminal SEV and determine whether the terminal is being used to output severity information or row hammer alert information based on whether the memory device is also outputting read data (and if so, in which burst position within the burst). That is, while a conventional host may only monitor the severity terminal SEV during certain burst positions of read data, a host configured in accordance with embodiments of the present technology may continually monitor the terminal. If the host detects that the severity terminal SEV is being used to output row hammer alert indications, and the terminal asserts, the host may suspend further operations with the memory device 100 until the row hammer alert indication de-asserts. That is, for example, the host may stop transmitted read requests, write requests, etc. to the memory device 100.

Although FIG. 1 illustrates an embodiment of the memory device 100 in which the row hammer mitigation circuit 190 and row hammer alert circuit 192 are illustrated as different components, in some embodiments one or more of the aforementioned circuits can be combined. For example, in some embodiments, the row hammer mitigation circuit 190 and row hammer alert circuit 192 are a single circuit that performs row hammer detection, mitigation, and alert functions.

Although FIG. 1 illustrates an embodiment of the memory device 100 with a single channel (e.g., single command and address terminals, a single data terminal, etc.), embodiments of the memory device may have multiple channels that may be further divided into PCs. In embodiments, the row hammer mitigation circuit 190 can be configured to detect and mitigate row hammer attacks on a per-channel or per-PC basis (e.g., attacks impacting the memory array 150 rows associated with a particular channel or PC). Similarly, the row hammer alert circuit 192 can be configured to generate per-channel or per-PC row hammer alerts. In embodiments, the memory device 100 includes multiple severity terminals SEV, where each terminal is associated with a single channel or PC. The memory device 100 can therefore alert a host, on a per-channel or per-PC basis, of a row hammer attack condition.

Figure 2:
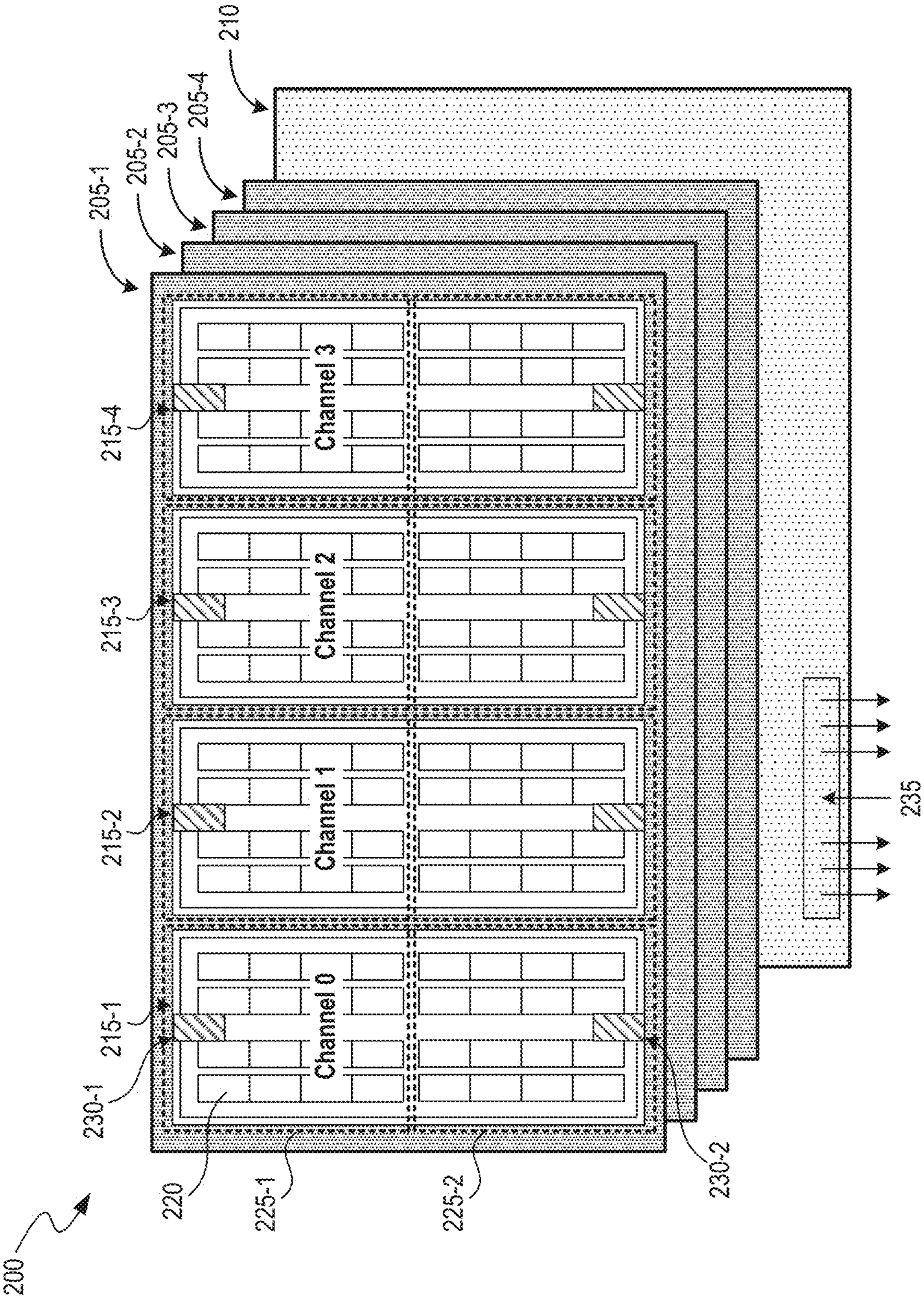
FIG. 2 illustrates a simplified block diagram schematically illustrating a high bandwidth memory device in accordance with an embodiment of the present technology.

FIG. 2 illustrates a simplified block diagram schematically illustrating an HBM device 200 in accordance with an embodiment of the present technology. The HBM device 200 includes a stack of multiple DRAM devices 205 and an interface die 210. In the embodiment illustrated in FIG. 2, the HBM device 200 includes a stack of four DRAM devices (i.e., DRAM device 205-1, DRAM device 205-2, DRAM device 205-3, and DRAM device 205-4), although it will be appreciated that in other embodiments the HBM device 200 can include a different number of DRAM devices. The DRAM devices 205 and/or interface die 210 can provide one or more of the memory storage, functionalities, interfaces, etc., discussed above with respect to the memory device 100 of FIG. 1.

The DRAM device 205 can include one or more channels 215, each of which provides an independent interface to DRAM storage 220. For example, as illustrated in FIG. 2, DRAM device 205-1 can include four channels: a first channel 215-1, a second channel 215-2, a third channel 215-3, and a fourth channel 215-4, where each channel is associated with DRAM storage 220 that can only be accessed using that channel. Although FIG. 2 illustrates only the channels of DRAM device 205-1, it will be appreciated that the other DRAM devices 205 of the HBM device 200 can have one or more channels. Furthermore, while FIG. 2 illustrates an embodiment in which the DRAM device 205-1 has four channels, in embodiments the DRAM device can have other numbers of channels. Additionally, different DRAM devices 205 within the HBM device 200 can have different numbers of channels.

The channels 215, and DRAM storage 220 therein, can be further divided into pseudo channels that may operate semi-independently from the other pseudo channels of the channel. For example, as illustrated in FIG. 2, the first channel 215-1 can be divided into a first pseudo channel 225-1 and a second pseudo channel 225-2. The other channels 215 of the DRAM devices 205 may similarly be divided into pseudo channels 225.

The DRAM devices 205 may additionally include row hammer alert circuitry configured to generate a row hammer alert signal. In embodiments, the row hammer alert circuitry may be configured to generate individual row hammer alert signals associated with individual channels or pseudo channels of the HBM device 200. For example, in the embodiment illustrated in FIG. 2, row hammer alert circuitry 230-1 may generate an alert signal associated with first pseudo channel 225-1 and row hammer alert circuitry 230-2 may generate an alert signal associated with second pseudo channel 225-2 of first channel 215-1. The HBM device 200 may include additional row hammer alert circuitry (not shown) for the other DRAM devices 205, channels 215, and pseudo channels 225. Although FIG. 2 illustrates an embodiment in which the row hammer circuitry is part of the DRAM devices 205, in embodiments the row hammer circuitry can be part of the interface die 210 or other component of the HBM device 200.

The interface die can include a severity interface 235 over which one or more severity signals can be transmitted to a host coupled to the HBM device. In embodiments, the severity interface 235 includes one or more severity signals per pseudo channel 225 of the HBM device 200. The severity interface 235 can also be configured to transmit row hammer alert signals (e.g., generated by row hammer alert circuitry) to the host. As described herein, the severity interface 235 can be configured to transmit severity signals during certain operations of the HBM device 200 and row hammer alert signals during other operations of the HBM device 200. Further, both the severity signals and row hammer alert signals can be transmitted by the severity interface 235 on a per-channel or per-pseudo-channel basis. For example, a portion of the severity interface 235 associated with one pseudo channel may be used to transmit severity information, while at the same time a different portion of the severity interface associated with another pseudo channel may be used to transmit row hammer alert information.

FIG. 3 illustrates a severity interface encoding 300 in accordance with an embodiment of the present technology. The severity interface encoding 300 may be used by components of a memory system that provides overloaded per-channel alert signaling. For example, an HBM device may encode information to be transmitted over a severity interface 302 according to the severity interface encoding 300, and a host and/or memory controller may decode the information received over the severity interface according to the severity interface encoding 300. The severity interface encoding 300 may be used to encode information transmitted over any of multiple severity interfaces 302 between an HBM device and host in a memory system. That is, there may be multiple severity interfaces 302 (each associated with a channel and/or pseudo channel), each of which may be encoded according to severity interface encoding 300.

The severity interface encoding 300 illustrates how information is encoded on a severity interface 302 during a read operation (e.g., in response to a read request from the host). Further, the severity interface encoding 300 illustrates the operation of the severity interface 302 during the burst in which the data is transferred, as part of the read operation, over a data interface (e.g., DQ). The severity interface encoding 300 illustrates an embodiment in which the data is transferred over a burst of length 8 (e.g., BL8), made up of burst positions 0-7. In other embodiments, the severity interface encoding 300 may be adapted for other burst lengths used to transfer data (e.g., BL16, BL24, BL32, etc.).

During a severity portion 305 of the burst, the severity interface 302 may be used to encode severity information. For example, the severity interface 302 may be used during the severity portion 305 to encode whether the transmitted read data contains no error 310, a corrected single-bit error 315, corrected multi-bit errors 320, or an uncorrectable error 325. In the embodiment of the severity interface encoding 300 illustrated in FIG. 3, the severity portion 305 occupies burst positions 4-7 of the burst. However, it will be appreciated that in other embodiments of the severity interface encoding 300 the severity portion 305 may occupy other burst positions of the burst. For example, in a burst of length 32 (burst positions 0-31), the severity portion 305 may occupy burst positions 28-31.

During an alert portion 330 of the burst, the severity interface may be used to transmit row hammer alert information. As described herein, the row hammer alert information may indicate to a host whether the channel, pseudo channel, etc., associated with the severity interface 302 is under attack. For example, if the severity interface 302 is asserted during the alert portion 330, that may indicate to a host that the corresponding channel, pseudo channel, etc., is under attack. Further, if the severity interface 302 is not asserted during the alert portion 330, that may indicate to a host that the corresponding channel, pseudo channel, etc., is not under attack.

FIG. 3 illustrates an embodiment of the severity interface encoding 300 in which the alert portion 330 occupied burst positions 0-3. It will be appreciated that in other embodiments the alert portion 330 can occupy other burst positions, fewer burst positions, etc. For example, while FIG. 3 illustrates an embodiment in which all burst positions outside of the severity portion 305 are used as the alert portion 330, in embodiments only a subset of the burst positions outside the severity portion are used as the alert portion. Additionally, while FIG. 3 illustrates an embodiment in which the severity interface 302 includes two pins (e.g., SEV [1:0]), both of which are used to indicate row hammer alert information during the alert portion 330, in embodiments the severity interface can include more or fewer pins, some of which may not be used for transmitting row hammer alert information during the alert portion (e.g., they may be don't cares or may be used to transmit other information).

As described above, the severity interface encoding 300 illustrates an embodiment of an encoding, used for the severity interface 302, during the burst in which read data is transmitted as part of a read operation (e.g., in response to a read request from a host). Other encodings, not shown, may be used for the severity interface 302 when read data is not being transmitted in a burst. In some embodiments, if read data is not being transmitted in a burst over a data interface, the severity interface 302 is used to encode row hammer alert information.

Figure 4:
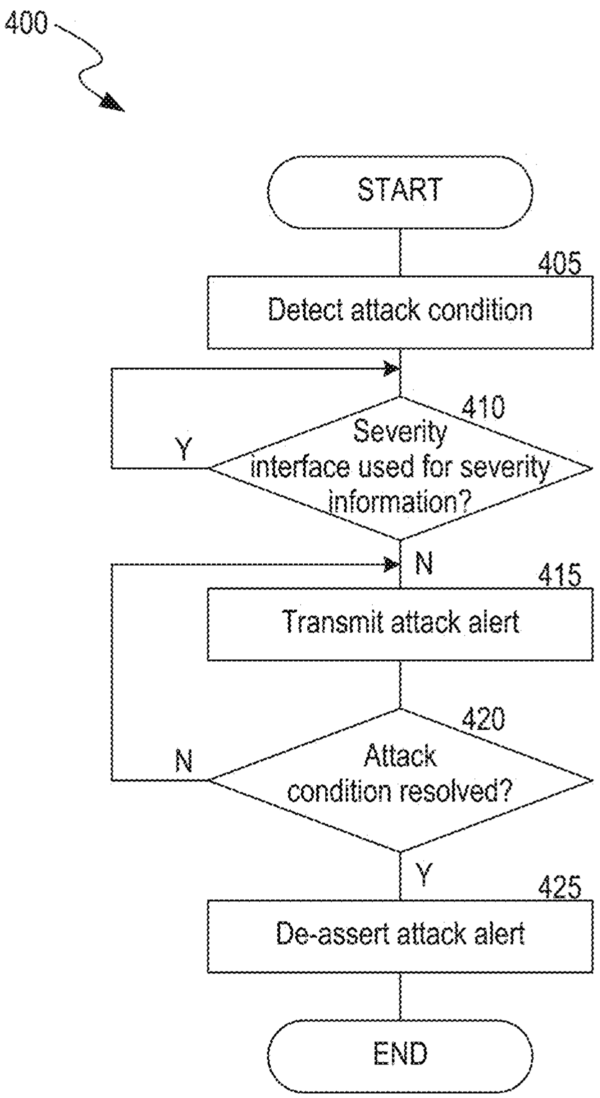
FIG. 4 is a flow diagram illustrating a process for alerting to a row hammer attack in accordance with an embodiment of the present technology.

FIG. 4 is a flow diagram illustrating a process 400 for alerting to a row hammer attack in accordance with an embodiment of the present technology. Aspects of the process 400 can be performed, for example, by a memory device (e.g., a DRAM device, an HBM device, etc.) and/or a component thereof (e.g., a row hammer alert circuit).

The process 400 begins at block 405, where a memory device detects a condition of a row hammer attack on the memory device (or a portion thereof). For example, the memory device may detect that a threshold number of rows in a memory array of the memory device have been primed, that a threshold number of rows require refresh, that a mitigation queue of the memory device is at a threshold utilization level, etc.

At decision block 410, the memory device determines whether a severity interface between the memory device and a coupled host is being used to transmit severity information. For example, the memory device may determine whether it is transmitting read data to the host (e.g., in response to a read request), and if so, in what burst position within the read burst. If the memory device determines that the severity interface is being used to transmit severity information, then the process returns to decision block 410 (e.g., to re-evaluate whether the severity interface is being used to transmit severity information). If the memory device determines that the severity interface is not being used to transmit severity information, then processing continues to block 415.

At block 415, the memory device transmits row hammer alert indication over the severity interface. For example, the memory device may assert a signal (e.g., set to a logical 1) of the severity interface to indicate the occurrence of a row hammer attack.

At decision block 420, the memory device determines whether the condition of the row hammer attack has been resolved. For example, the memory device may determine whether a sufficient number of rows of the memory array of the memory device have been refreshed. If the memory device determines that the condition of the row hammer attack has not been resolved, then the process 400 returns to block 415 (e.g., to continue to assert the row hammer alert indication). If the memory device determines that the condition of the row hammer attack has been resolved, processing continues to block 425.

At block 425, the memory device de-asserts the row hammer alert indication on the severity interface. The process 400 then ends.

Figure 5:
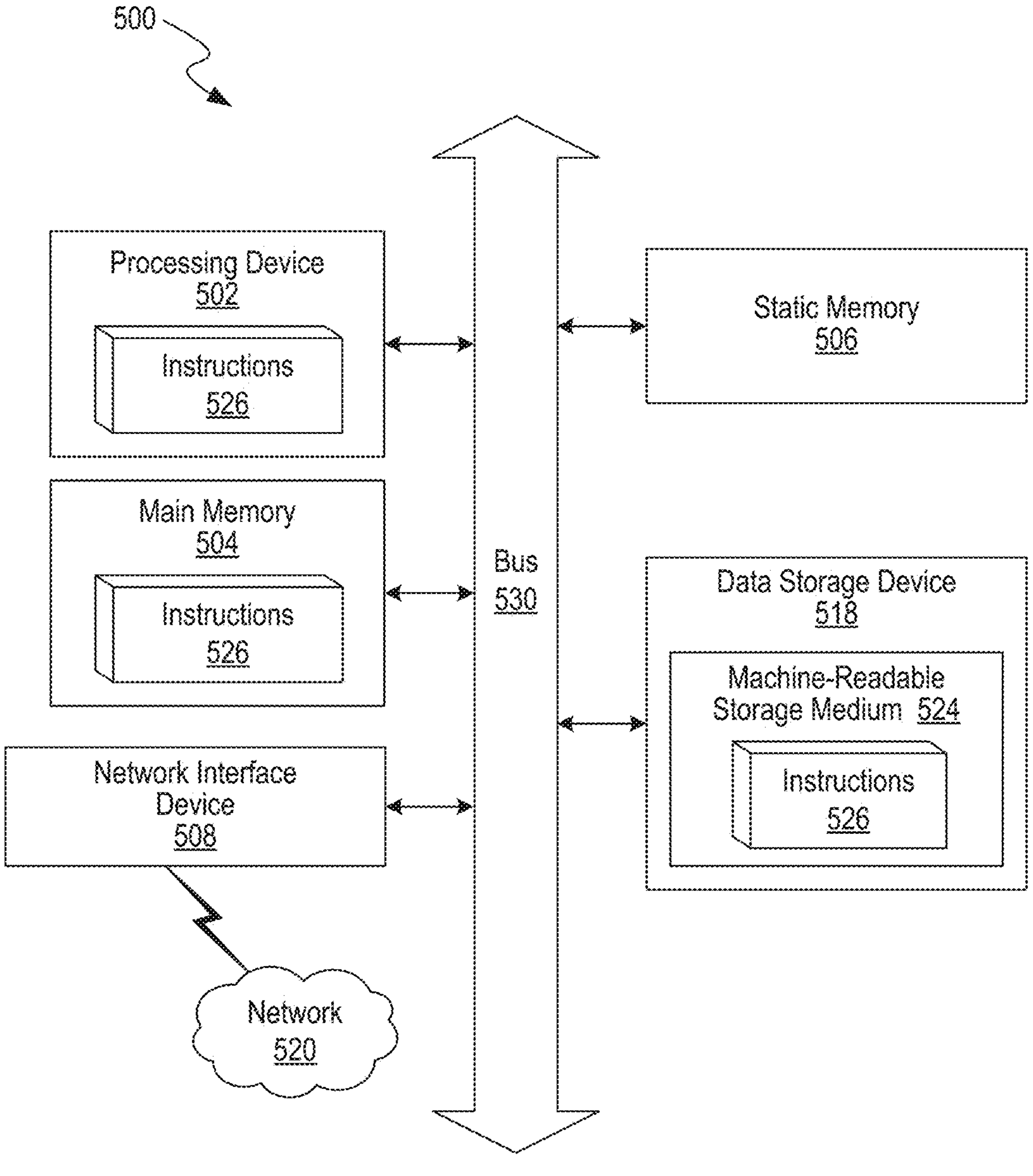
FIG. 5 is a block diagram of an example computer system in accordance with an embodiment of the present disclosure.

FIG. 5 illustrates the block diagram of an example machine of a computer system 500 within which a set of instructions for causing the machine to perform any one or more of the methodologies discussed herein can be executed. In alternative embodiments, the machine can be connected (e.g., networked) to other machines in a LAN, an intranet, an extranet, and/or the internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer, a tablet computer, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., ROM, flash memory, DRAM such as SDRAM or Rambus DRAM (RDRAM), etc.), a static memory 506 (e.g., flash memory, static RAM (SRAM), etc.), and a data storage system 518, which communicate with each other via a bus 530. In accordance with one aspect of the present disclosure, the main memory 504 can report (e.g., to the processing device 502) per-channel instances of row hammer attacks on the main memory.

The processing device 502 represents one or more general-purpose processing devices such as a microprocessor, a central processing unit, or the like. More particularly, the processing device can be a complex instruction set computing (CISC) microprocessor, a reduced instruction set computing (RISC) microprocessor, a very long instruction word (VLIW) microprocessor, a processor implementing other instruction sets, or a processor implementing a combination of instruction sets. The processing device 502 can also be one or more special-purpose processing devices such as an application-specific integrated circuit (ASIC), a field programmable gate array (FPGA), a digital signal processor (DSP), a network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which are stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media.

While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine, which instructions cause the machine to perform any one or more of the methodologies of the present disclosure. The term "machine-readable storage medium" shall accordingly be taken to include, but not be limited to, solid-state memories, optical media, and magnetic media.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate or subregions of the substrate may be controlled through doping using various chemical species including, but not limited to, phosphorus, boron, or arsenic. Doping may be performed during the initial formation or growth of the substrate, by ion implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, that the operations and the steps may be rearranged or otherwise modified, and that other implementations are possible. Furthermore, embodiments from two or more of the methods may be combined.

From the foregoing, it will be appreciated that specific embodiments of the invention have been described herein for purposes of illustration but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods, in addition to those specific embodiments disclosed herein, may be within the scope of the present technology.

I claim:

1. A high bandwidth memory (HBM) device comprising:

a plurality of channels coupled to a host, each channel associated with a command/address bus, a data (DQ) bus, and a severity interface separate from the data (DQ) bus and usable to transmit severity information indicating severity of errors detected by error correction code processing; and a plurality of vertically stacked memory dies, each of the memory dies comprising:

one or more memory banks, each memory bank associated with one of the plurality of channels;

one or more interfaces, each interface associated with a channel, from the plurality of channels, associated with a memory bank of the one or more memory banks; and a row hammer alert circuit configured to:

detect a row hammer attack on a memory bank of the one or more memory banks;

determine whether the severity interface associated with the channel that is associated with the memory bank is transmitting severity information; and transmit, over the severity interface associated with the channel that is associated with the memory bank, a row hammer alert to the host when the severity interface is not being used to transmit severity information, wherein the row hammer alert indicates detection of the row hammer attack on the channel that is associated with the memory bank.

2. The HBM device of claim 1, wherein each memory bank includes a plurality of rows of memory cells, and wherein, to detect the row hammer attack on the memory bank, the row hammer alert circuit of each of the memory dies is configured to:

determine a number of primed rows in the memory bank associated with activation counts that do not exceed an activation threshold corresponding to an activation count that triggers a refresh of adjacent victim rows but that do exceed a threshold corresponding to a non-zero activation count that is less than the activation threshold; and evaluate whether the determined number of primed rows exceeds a primed row threshold corresponding to a number of primed rows indicative of a row hammer attack.

3. The HBM device of claim 1, wherein each memory bank includes a plurality of rows of memory cells, wherein the HBM device further comprises a mitigation queue configured to queue row addresses associated with victim rows to be refreshed, and wherein, to detecting the row hammer attack on the memory bank, the row hammer alert circuit of each of the memory dies is configured to:

determine a number of mitigation queue entries associated with victim row addresses corresponding to the memory bank; and evaluate whether the determined number of mitigation queue entries exceeds a queue threshold corresponding to a number of mitigation queue entries indicative of a row hammer attack.

4. The HBM device of claim 1, wherein, for each channel, the HBM device is configured to, over a burst comprised of a plurality of burst positions, transmit read data to the host, over the data bus associated with the channel, and wherein, to determine whether the severity interface is transmitting severity information, the row hammer alert circuit of each of the memory dies is configured to:

determine whether the data bus associated with the channel is being used to transmit read data to the host;

based on the determination that the data bus is being used to transmit read data, determine a current burst position of a current read burst; and evaluate whether the current burst position is used for transmitting the severity information via the severity interface associated with the channel.

5. The HBM device of claim 4, wherein the burst comprises eight (8) burst positions (UI0-UI7), and wherein the row hammer alert circuit of each of the memory dies is configured, during at least UI0-UI3, to transmit the row hammer alert to the host via the severity interface associated with the channel.

6. The HBM device of claim 1, wherein the HBM device is comprises 32 channels.

7. The HBM device of claim 1, wherein:

each channel is divided into a first pseudo channel and a second pseudo channel;

a first portion of the severity interface associated with the channel that is associated with the memory bank is associated with the first pseudo channel of the channel;

a second portion of the severity interface associated with the channel that is associated with the memory bank is associated with the second pseudo channel of the channel;

the row hammer alert circuit of each of the memory dies is configured, for the first pseudo channel, to detect the row hammer attack on a first portion of the memory bank associated with the first pseudo channel, determine whether the first portion of the severity interface associated with the first pseudo channel is transmitting severity information, and transmit the row hammer alert to the host over the first portion of the severity interface when the first portion of the severity interface is not being used to transmit severity information; and the row hammer alert circuit of each of the memory dies is further configured, for the second pseudo channel, to detect a row hammer attack on the second portion of the memory bank associated with the second pseudo channel, determine whether the second portion of the severity interface associated with the second pseudo channel is transmitting severity information, and transmit, over the second portion of the severity interface, a second row hammer alert to the host when the second portion of the severity interface is not being used to transmit severity information.

8. A memory device, comprising:

a memory array including a plurality of rows of memory cells;

a row hammer mitigation circuit configured to determine whether to perform a mitigation action on a row of the plurality of rows; and a row hammer alert circuit configured to:

generate a row hammer alert indicative of whether a row hammer attack at the memory device has been detected; and transmit, via a severity interface of the memory device used by the memory device to transmit severity information indicating severity of errors detected by error correction code processing, the row hammer alert to a host at a time when the severity interface is not being used to transmit severity information, wherein the severity interface is separate from a data (DQ) bus used by the memory device to send or receive data to or from, respectively, the host.

9. The memory device of claim 8, wherein, to determine whether to perform the mitigation action on the row, the row hammer mitigation circuit is configured to:

randomly sample requests received by the memory device from a host, each sampled request comprising a memory address;

determine, for each sampled request, the row of the plurality of rows associated with the memory address; and evaluate a frequency of samples associated with the row.

10. The memory device of claim 8, wherein each row of the plurality of rows comprises activation count bits, wherein the memory device is configured to increment the activation count bits of a row when the row is activated, and wherein, to determine whether to perform the mitigation action on the row, the row hammer mitigation circuit is configured to compare the activation count bits of the row to an activation threshold corresponding to an activation count that triggers a refresh of adjacent victim rows.

11. The memory device of claim 8, wherein, to generate the row hammer alert, comprises the row hammer alert circuit is configured to:

determine a number of rows in the memory array that are associated with activation counts that not exceed an activation threshold corresponding to an activation count that triggers a refresh of adjacent victim rows but that do exceed a threshold corresponding to a non-zero activation count that is less than the activation threshold; and evaluate whether the determined number of rows exceeds a third threshold corresponding to a number of rows indicative of a row hammer attack.

12. The memory device of claim 8, wherein the memory device further comprises a mitigation queue configured to queue victim row addresses associated with rows on which a mitigation action will be performed, and wherein, to generate the row hammer alert, the row hammer alert circuit is configured to:

determine utilization of the mitigation queue; and evaluate whether the utilization exceeds a utilization threshold.

13. The memory device of claim 8, wherein the time is a first time, and wherein the row hammer alert circuit is further configured to:

determine, at a second time, that severity information is being transmitted to the host via the severity interface;

based on the determination at the second time that severity information is being transmitted to the host via the severity interface, maintain the generated row hammer alert in a row hammer alert state; and transmit the maintained row hammer alert, from the row hammer alert state, to the host via the severity interface at the first time when severity information is no longer being transmitted to the host via the severity interface.

14. The memory device of claim 8, wherein the memory device is configured to transmit, via a data bus, read data to the host over a burst comprising a plurality of burst positions, and wherein the row hammer alert circuit is further configured to determine whether severity information is being transmitted to the host via the severity interface based on a determination of a current burst position of a current read data burst.

15. The memory device of claim 14, wherein the burst comprises eight burst positions (UI0-UI7), and wherein the row hammer alert circuit is configured to determines that severity information is being transmitted to the host via the severity interface when the memory device is in burst positions UI4-UI7 of a read data burst.

16. The memory device of claim 8, wherein the memory device further comprises a plurality of channel interfaces that are coupled to the host, and wherein the row hammer alert is a first row hammer alert indicating detection of a row hammer attack associated with a first channel interface of the plurality of channel interfaces.

17. The memory device of claim 16, wherein the severity interface is a first severity interface associated with the first channel interface, and wherein the row hammer alert circuit is further configured, for a second channel interface of the plurality of channel interfaces, to (i) generate a second row hammer alert indicative of whether a row hammer attack, associated with the second channel interface has been detected, and (ii) transmit, via a second severity interface associated with the second channel interface, the second row hammer alert to the host at a time when the second severity interface is not being used to transmit severity information to the host.

18. The memory device of claim 8, wherein the memory device is a high bandwidth memory device.

19. A method comprising:

receiving, by a memory controller, information over a severity interface coupled to a high bandwidth memory (HBM) device, the severity interface associated with a channel of the HBM device and different from a data (DQ) bus coupled to the HBM device;

determining whether the information is associated with (a) severity information indicative of severity of errors detected by error correction code processing or (b) row hammer alert information;

based on a determination that the information is associated with row hammer alert information, evaluating the information to determine whether the information indicates that a row hammer attack associated with the channel has been detected; and suspending, based on a determination that the information indicates that a row hammer associated with the channel has been detected, requests transmitted to the HBM device over a command/address interface associated with the channel.

20. The method of claim 19, further comprising:

transmitting a request to the HBM device, over a second command/address interface, while requests over the command/address interface are suspended.

* * * * *